(12) United States Patent
Min

(10) Patent No.: US 7,550,378 B2
(45) Date of Patent: Jun. 23, 2009

(54) METHOD OF MANUFACTURING A SEMICONDUCTOR DEVICE HAVING A CELL AREA WITH A HIGH DEVICE ELEMENT DENSITY

(75) Inventor: Dae Hong Min, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 156 days.

(21) Appl. No.: 11/616,275

(22) Filed: Dec. 26, 2006

(65) Prior Publication Data

US 2007/0148969 A1    Jun. 28, 2007

(30) Foreign Application Priority Data

Dec. 27, 2005   (KR) ...................... 10-2005-0130777

(51) Int. Cl.
*H01L 21/4763* (2006.01)
(52) U.S. Cl. ...................................... 438/633
(58) Field of Classification Search ................. 438/691, 438/669, 633
See application file for complete search history.

(56) References Cited

U.S. PATENT DOCUMENTS 6,232,228 B1 *   5/2001   Kwag et al. ................. 438/669
2005/0026439 A1 *   2/2005   Watanabe et al. ........... 438/691

\* cited by examiner

*Primary Examiner*—Davienne Monbleau
*Assistant Examiner*—Monica D Harrison
(74) *Attorney, Agent, or Firm*—Sherr & Vaughn, PLLC

(57) ABSTRACT

A method for manufacturing a semiconductor device including providing a semiconductor substrate including a cell area formed with relatively high device element density and a scribe line area formed with a device element density lower than the device element density of the cell area. An insulating layer is deposited over the semiconductor substrate. The insulating layer is planarized through a chemical mechanical polishing (CMP) process including a first polishing step and a second polishing step having different removal rates with respect to the insulating layer formed over the cell area and the scribe area.

17 Claims, 6 Drawing Sheets

METHOD OF MANUFACTURING A SEMICONDUCTOR DEVICE HAVING A CELL AREA WITH A HIGH DEVICE ELEMENT DENSITY

The present application claims priority under 35 U.S.C. 119 and 35 U.S.C. 365 to Korean Patent Application No. 10-2005-0130777 (filed on Dec. 27, 2005), which is hereby incorporated by reference in its entirety.

BACKGROUND

In order to perform a photolithographic process for forming a pattern when manufacturing a semiconductor device, various key patterns exist on a scribe line for performing align and overlay. FIG. 1 is a sectional view showing a key pattern formed in a semiconductor device according to a related art.

As shown in FIG. 1, a chemical mechanical polishing (CMP) process may be performed on an oxide layer 12 deposited over a semiconductor substrate 10, with a key pattern formed on a scribe line (S) defining cell areas (C). Since a removal rate of a sloped part (A) of the oxide layer 12 deposited on the key pattern is relatively high as compared with those of the cell areas, a discoloration phenomenon occurs. If the discoloration phenomenon on the scribe line (S) spreads to the cell area (C), a defocus phenomenon may be caused during subsequent processes for forming a via. As a result, a hole may not be defined, so the via may not be formed.

SUMMARY

Embodiments relate to a method for manufacturing a semiconductor device, capable of forming a stable pattern.

Embodiments relate to reducing a removal rate difference between a cell area and a key pattern area by improving a chemical mechanical polishing (CMP) process.

Embodiments relate to a method for manufacturing a semiconductor device including providing a semiconductor substrate including a cell area formed with relatively high device element density and a scribe line area formed with a device element density lower than the device element density of the cell area. An insulating layer is deposited over the semiconductor substrate. The insulating layer is planarized through a chemical mechanical polishing (CMP) process including a first polishing step and a second polishing step having different removal rates with respect to the insulating layer formed over the cell area and the scribe area.

The planarizing the insulating layer further includes planarizing the insulating layer formed over the cell area without changing an amount of surfactant used for controlling the removal rate of the chemical mechanical process through the first polishing step.

The insulating layer formed over the scribe area is planarized by significantly reducing the amount of the surfactant through the second polishing step.

A metal layer is formed over the cell area and the scribe line area of the semiconductor substrate. A metal interconnection is electrically connected to the metal layer.

The step of forming the metal layer in the cell area and the scribe line area of the semiconductor substrate includes depositing tungsten such that a hole formed in the cell area and a key pattern formed in the scribe area are filled with the tungsten, and planarizing the tungsten through the chemical mechanical polishing process.

Gaps exist between device elements in the cell area and the scribe line area. The gaps in the cell area are relatively narrow, and the gaps in the scribe area are relatively wide.

According to embodiments, a CMP process is divided into two steps, and, in a second step, the amount of surfactant is reduced. It is thereby possible to eliminate a removal rate difference between parts of a cell and a key pattern. Accordingly, substrate or wafer topology is maintained after a deposition process, thereby preventing the discolor phenomenon from spreading to the cell. Therefore, a defocus phenomenon does not occur in subsequent processes, so a precise and reliable patterning process can be performed. As a result, it is possible to improve the productivity and the yield rate of a semiconductor device.

BRIEF DESCRIPTION OF THE DRAWINGS

Example

Example

DETAILED DESCRIPTION

Figure 1:
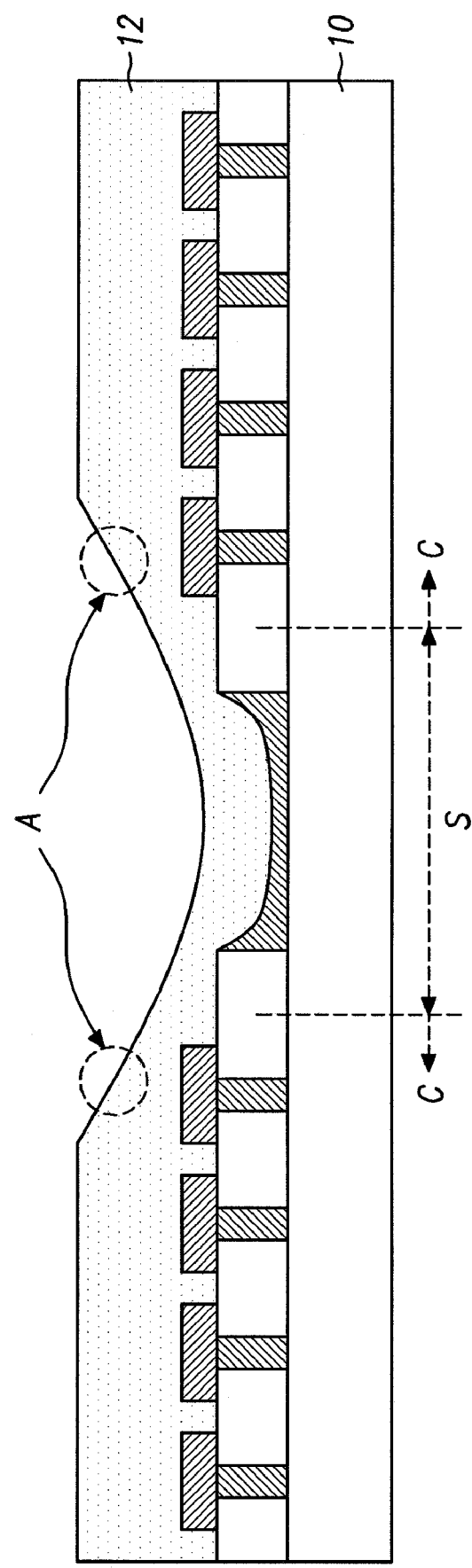
FIG. 1 is a sectional view showing a key pattern formed in a semiconductor device according to a related art.
Figure 2:
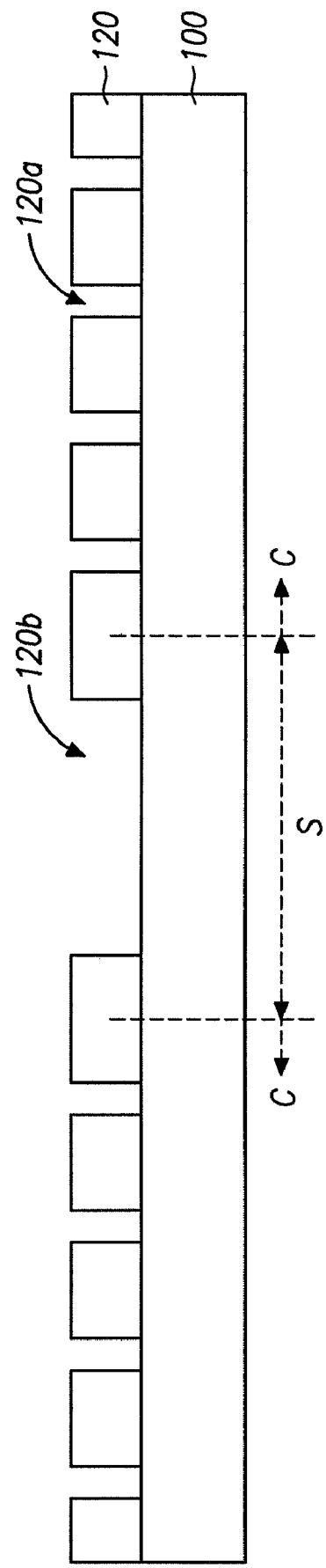
FIGS. 2 to 5 are sectional views showing a method for manufacturing a semiconductor device according embodiments.

Referring to FIG. 2, an oxide pattern 120 is formed over a semiconductor wafer or a semiconductor substrate 100. The semiconductor substrate 100 includes cell areas (C) and a scribe line (S) between the cell areas (C). A photo key pattern exists on the scribe line (S) in order to perform alignment and overlay steps. Such a photo key pattern (S) is designed in a reticle frame. In addition, the photo key pattern (S) may be used for connecting interconnections between layers. An area of the photo key pattern (S) includes a trench 120b having a width much wider than widths of holes 120a densely formed in the cell area (C).

Figure 3:
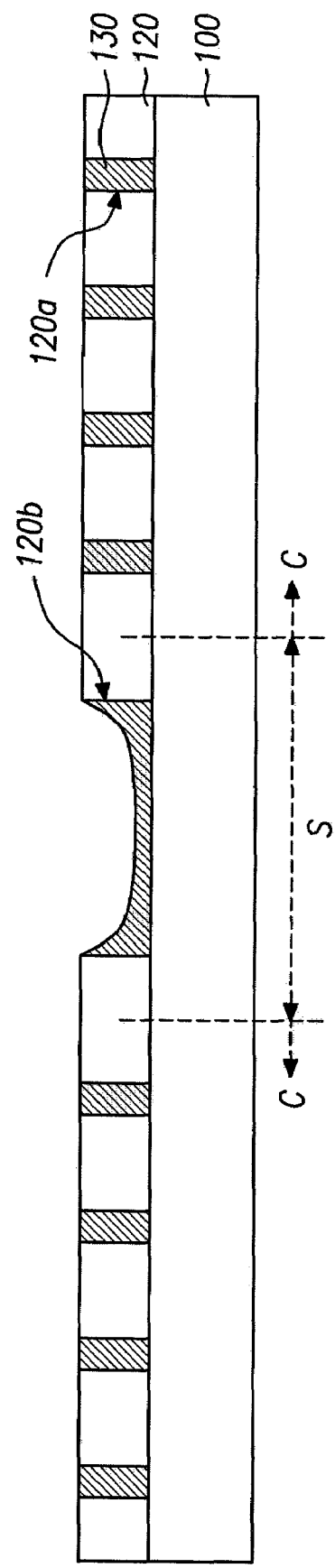

Referring to FIG. 3, tungsten (W) is deposited in order to fill gaps, such as the holes 120a and the trench 120b, formed in the oxide pattern 120. A chemical mechanical polishing (CMP) process is performed over the resultant structure, thereby forming a plug 130. At this time, although gap filling is completed in the high density cell area (C), gap filling is insufficient in the photo key pattern area (S).

Figure 4:
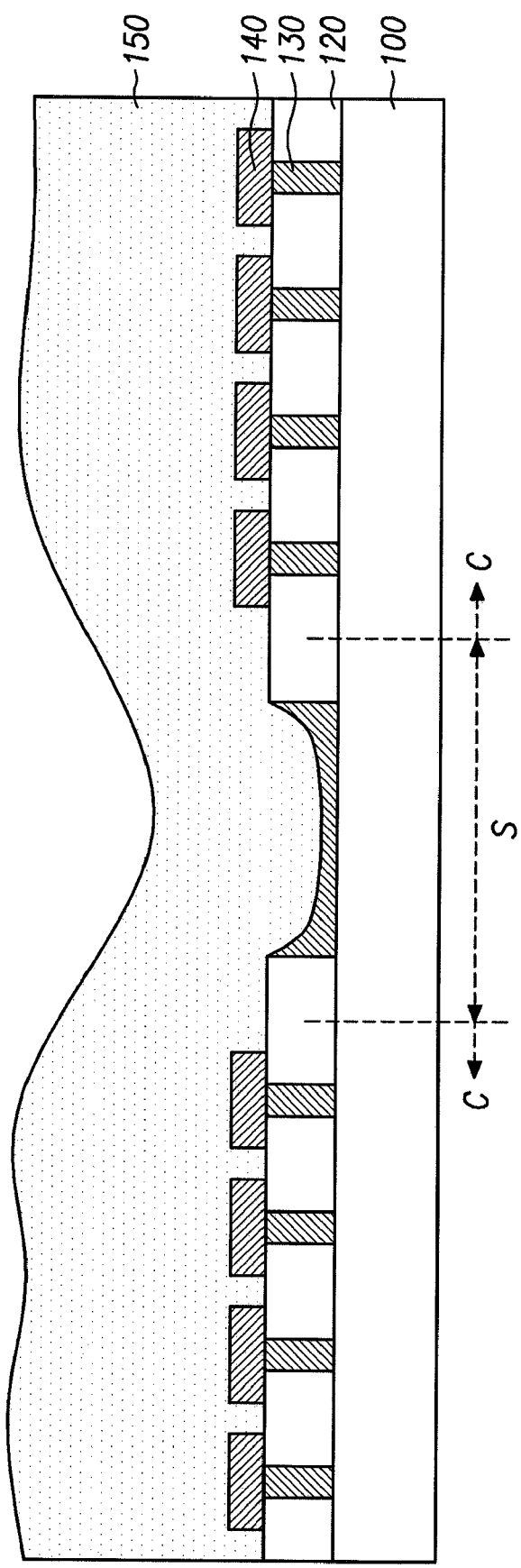

Referring to FIG. 4, metal is deposited and then patterned over the oxide layer pattern 120, thereby forming a metal interconnection 140 electrically connected to the plug 130. Thereafter, an oxide material is deposited through chemical vapor deposition (CVD), forming an inter-metal dielectric (IMD) layer 150. Since the cell area (C) has a relatively high device element density as compared with the photo key pattern area (S), a step height difference exists between the cell area (C) and the photo key pattern area (S).

Figure 5:
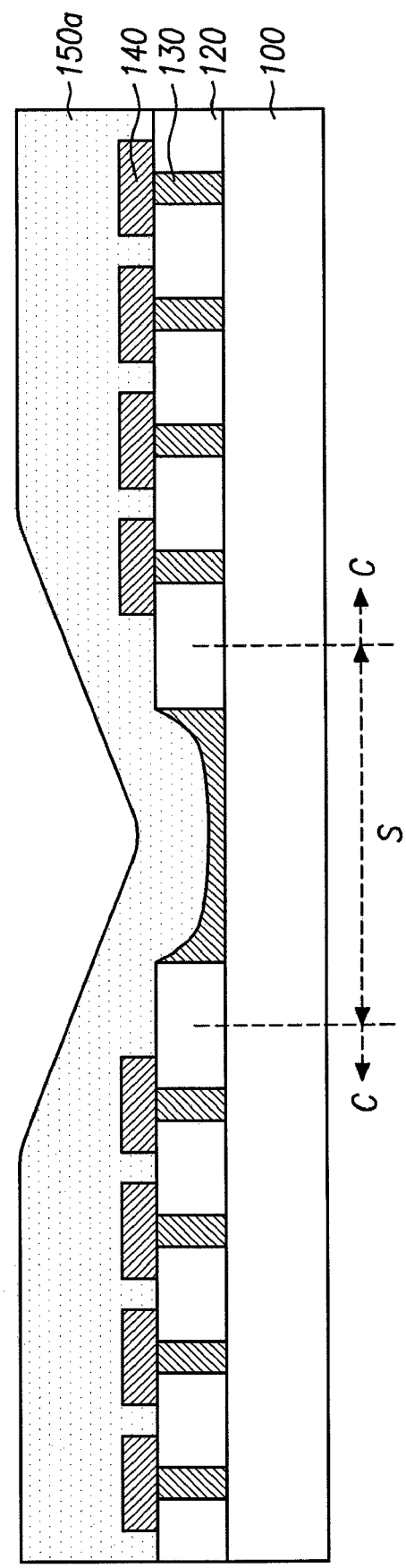

Referring to FIG. 5, the interlayer dielectric layer 150 is planarized through a CMP process. A photo process following the CMP process ensures a process margin according to the profile of the CMP process. If a plasma etching process (PEP) is performed over an area which is not planarized, a defocus phenomenon occurs during the exposure process, so patterning fails. The defocus phenomenon causes a discoloration to spread to a part of the cell area (C) requiring a via due to the step difference of the scribe line (S) on which the photo key pattern having a relatively wide width exist, so a patterning defect may occur. In other words, the via is not formed. Therefore, according to embodiments, a removal rate is controlled in multiple steps by using surfactant during the CMP process. Accordingly, it is possible to remove or reduce the discoloration phenomenon caused by the CMP process.

In the CMP process, ceria based chemicals or cerium oxide based chemicals are used as slurry, and surfactant is added to the chemicals. Functions of the surfactant are mainly classified into two types. One is the self-stop function during the planarization of the inter-metal dielectric layer. The other is the control function for a removal rate according to an amount of surfactant used. According to embodiments, the function of controlling the removal rate may eliminate or reduce the discolor phenomenon.

Figure 6:
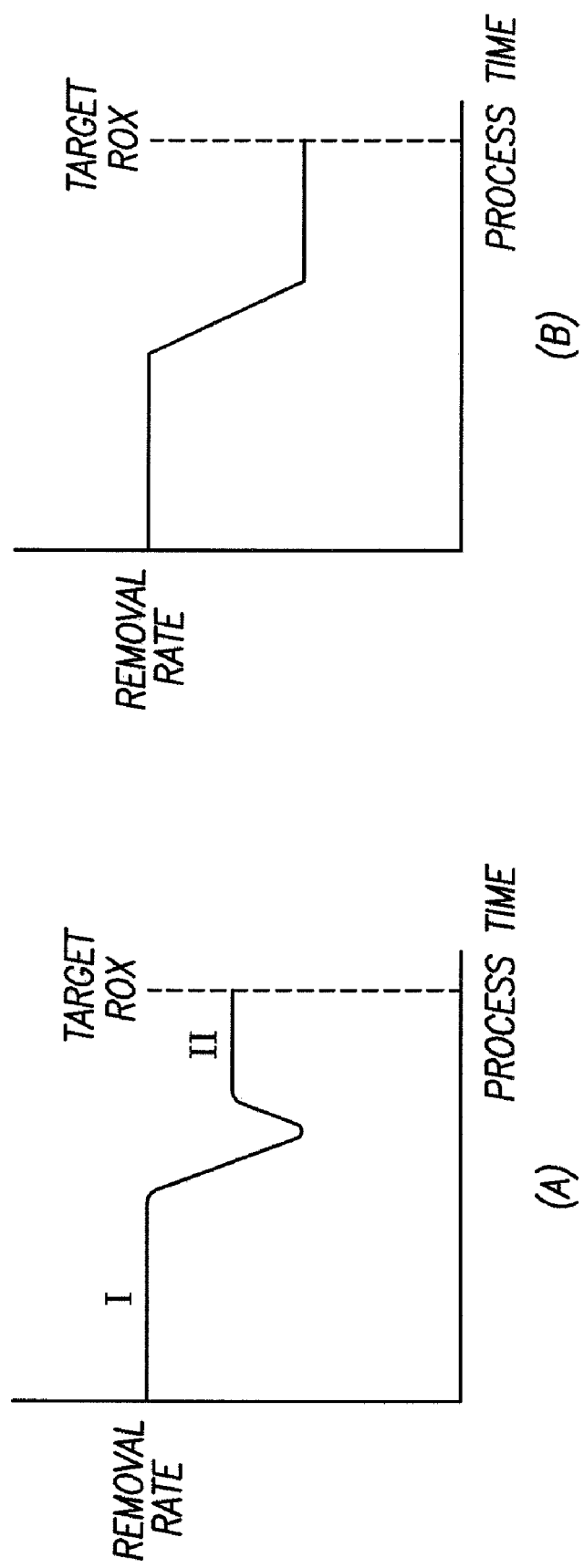
FIGS. 6A and 6B are graphs showing a removal rate of a CMP process in a method for manufacturing a semiconductor device according to embodiments.

However, as shown in (B) of FIG. 6, since the related CMP process is performed without changing the amount of surfactant used, the removal rate is reduced after an upper part of the cell area (C) is planarized. As a pressure profile relatively increases on the slanted photo key pattern (S) as compared with the planarized cell area (C), the removal rate increases. This causes the discoloration phenomenon described above. However, according to embodiments, a removal rate difference between the cell area (C) and the photo key pattern area (S) may be eliminated by changing an amount of used surfactant as described above.

Referring to (A) of FIG. 6, according to embodiments, the CMP process is performed in two steps. In a first step (I), the CMP process is performed while sufficiently providing surfactant, thereby planarizing the upper part of the cell area (C). In a second step (II), the CMP process is performed while rapidly reducing an amount of the surfactant. Through the CMP process with the two steps, a removal rate difference between the cell area (C) and the scribe line area (S) is eliminated, and topology is not changed after depositing the oxide layer 150.

As described above, if the CMP process is performed while changing an amount of surfactant used, and a removal rate difference between the cell area (C) and the photo key pattern area (S) is eliminated. Accordingly, the discoloration phenomenon does not occur, so it is possible to perform the following patterning process. A via can be formed through the patterning process.

As described above, according to embodiments, a CMP process is divided into two steps, and, in a second step, an amount of surfactant is reduced, so it is possible to eliminate a removal rate difference between upper parts of a cell and a key pattern. Accordingly, topology is maintained after a deposition process, thereby preventing the discoloration phenomenon from being spread to the inner part of the cell. Therefore, a defocus phenomenon does not occur, so a precise and reliable patterning process can be performed. As a result, it is possible to improve the productivity and the yield rate of a semiconductor device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a semiconductor device comprising:
    providing a semiconductor substrate including a cell area formed with relatively high device element density and a scribe line area formed with a device element density lower than the device element density of the cell area;
    depositing a first insulating layer over the semiconductor substrate and then patterning the first insulating layer to form a first trench in the scribe line area and second trenches in the cell area;
    forming metal plugs in the second trenches such that the uppermost surface of the metal plug is coplanar with the uppermost surface of the patterned first insulating layer;
    forming metal interconnections over the patterned first insulating layer and electrically connected to a respective one of the metal plugs;
    depositing a second insulating layer over the semiconductor substrate including the first insulating layer, the metal interconnections and the metal plugs such that a step height difference exists between the cell area and the scribe line area; and then
    planarizing the second insulating layer through a chemical mechanical polishing (CMP) process after forming the metal interconnections, the CMP process including a first polishing step and a second polishing step having different removal rates with respect to the second insulating layer formed over the cell area and the scribe area.

2. The method as claimed in claim 1, wherein said planarizing the second insulating layer comprises:
    planarizing the second insulating layer formed over the cell area without changing an amount of surfactant used for controlling the removal rate of the chemical mechanical process through the first polishing step; and
    planarizing the second insulating layer formed over the scribe area by significantly reducing the amount of the surfactant through the second polishing step.

3. The method as claimed in claim 1, wherein the step of forming the metal plugs comprises:
    depositing a tungsten layer to simultaneously partially fill the first trench and completely fill the second trenches; and then
    planarizing the tungsten layer in the second trenches through a second chemical mechanical polishing process such that the metal layer remains partially filled in the first trench.

4. A method for manufacturing a semiconductor device comprising:
    providing a semiconductor substrate including a cell area and a scribe line area, wherein the cell area is higher than the scribe area;
    depositing a first insulating layer over the semiconductor substrate and then forming first insulating layer patterns having a first trench in the scribe line area and second trenches in the cell area;
    simultaneously partially filling the first trench and completely filling the second trenches with a metal layer;
    performing a first chemical mechanical polishing process on the metal layer to form a metal plug in the second trenches such that the uppermost surface of the metal plug is coplanar with the uppermost surface of the first insulating layer patterns and the metal layer still partially fills the first trench;
    forming metal interconnections over the first insulating layer patterns and electrically connected to a respective one of the metal plugs;
    coating a second insulating layer over the semiconductor substrate such that a step height difference exists between the cell area and the scribe line area; and
    planarizing the second insulating layer through a second chemical mechanical polishing process including a first polishing step and a second polishing step having mutually different removal rates with respect to the second insulating layer formed over the cell area and the scribe area.

5. The method as claimed in claim 4, wherein the step of planarizing the second insulating layer includes the sub-steps of:

planarizing the second insulating layer formed over the upper part of the cell area without changing an amount of surfactant used for controlling the removal rate of the chemical mechanical process through the first polishing step; and planarizing the second insulating layer formed over the of the scribe area by significantly reducing the amount of the surfactant through the second polishing step.

6. A method comprising:

providing a semiconductor substrate having a cell area and a scribe line area with a photo key pattern area; and then forming a plurality of oxide patterns having a first trench formed in the photo key pattern area and a second trench formed in the cell area between respective oxide patterns, wherein the width of the first trench is greater than the width of the second trench; and then forming a metal plug in the second trench; and then forming a metal interconnection on the metal plug and electrically connected to the metal plug; and then forming an inter-metal dielectric layer over the semiconductor substrate including the cell area, the scribe area and the photo key pattern area, wherein a step height difference is formed in a portion of the inter-metal dielectric layer in the cell area and a portion of the inter-metal dielectric layer in the photo key pattern area; and then performing a chemical mechanical polishing process on the interlayer dielectric layer including controlling the removal rate of the interlayer dielectric layer by manipulating an amount of surfactant used in the chemical mechanical polishing process.

7. The method of claim 6, wherein forming the metal plugs comprises:

depositing a metal layer in the first trench and the second trench such that the first trench is partially filled and the second trench is completely filled; and then performing a chemical mechanical polishing process on the metal layer.

8. The method of claim 7, wherein the metal layer comprises tungsten.

9. The method of claim 6, wherein forming the metal interconnection comprises:

depositing a metal layer over the oxide layer and the metal plug and then patterning the metal layer.

10. The method of claim 6, wherein performing the chemical mechanical polishing process on the interlayer dielectric layer comprises:

performing a first chemical mechanical polishing process on a portion of the interlayer dielectric layer in the cell area while adding a surfactant; and then performing a second chemical mechanical polishing process on a portion of the interlayer dielectric layer in an non-cell area while rapidly reducing an amount of the surfactant.

11. The method of claim 10, wherein the difference in removal rate of the interlayer dielectric layer in the cell area and the interlayer dielectric layer in the photo key pattern area is zero.

12. A method of comprising:

providing a semiconductor substrate having a cell area and a photo key pattern area; and then forming a first oxide layer and then patterning the first oxide layer to form a first trench in the photo key pattern area and a plurality of second trenches in the cell area; and then forming a metal plug in each of the second trenches; and then forming a metal interconnection over the first oxide layer and electrically connected to the metal plug; and then forming a second oxide layer over the entire semiconductor substrate including the cell area and the photo key pattern area; and then performing a first chemical mechanical polishing process on a portion of the second oxide layer in the cell area while adding a surfactant material; and then performing a second chemical mechanical polishing process on a portion of the second oxide layer in the photo key pattern area while rapidly reducing an amount of the surfactant material.

13. The method of claim 12, wherein the first trench has a first width and the second trenches each have a second width, the first width being greater than the second width.

14. The method of claim 12, wherein the difference in removal rate of the portion of the second oxide layer in the cell area and the portion of the second oxide layer in the photo key pattern area is zero.

15. The method of claim 12, wherein forming the metal plugs comprises:

depositing a first metal layer in the first trench and the second trenches such that the first trench is partially filled and the second trenches are completely filled; and then performing a chemical mechanical polishing process on the first metal layer.

16. The method of claim 15, wherein the first metal layer comprises tungsten.

17. The method of claim 16, wherein forming the metal interconnection comprises:

depositing a second metal layer over the second oxide layer and the metal plugs and then patterning the second metal layer.

* * * * *